(12) United States Patent
Bezama et al.

(10) Patent No.: US 6,284,079 B1
(45) Date of Patent: Sep. 4, 2001

(54) METHOD AND STRUCTURE TO REDUCE LOW FORCE PIN PULL FAILURES IN CERAMIC SUBSTRATES

(75) Inventors: Raschid J. Bezama, Mahopac; Govindarajan Natarajan, Pleasant Valley, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/261,344

(22) Filed: Mar. 3, 1999

(51) Int. Cl.⁷ .................................................. B32B 31/26
(52) U.S. Cl. ..................................... 156/89.12; 156/89.16; 156/209; 427/96; 427/123
(58) Field of Search ........................... 156/89.12, 89.16, 156/209, 246; 29/851; 427/96, 126.2, 256, 269, 275, 287, 299, 309, 372.2, 375, 383.5, 444, 123

(56) References Cited

U.S. PATENT DOCUMENTS

| | | |
|---|---|---|
| 3,854,965 | * 12/1974 | Niwa et al. . |
| 3,953,562 | 4/1976 | Hait et al. . |
| 4,237,606 | 12/1980 | Niwa et al. . |
| 5,029,242 | 7/1991 | Sammet . |
| 5,045,402 | 9/1991 | Adams, Jr. et al. . |
| 5,252,655 | 10/1993 | Parker et al. . |
| 5,442,145 | * 8/1995 | Imai et al. . |
| 5,549,778 | * 8/1996 | Yokoyama et al. ................ 427/96 X |
| 5,614,043 | 3/1997 | Ritland et al. . |

FOREIGN PATENT DOCUMENTS

| | | |
|---|---|---|
| 61-2510 | * 1/1986 | (JP) . |
| 4-10903 | * 1/1992 | (JP) . |
| 4-37643 | * 2/1992 | (JP) . |
| 8-118467 | * 5/1996 | (JP) . |

OTHER PUBLICATIONS

IBM Technical Disclosure Bulletin, "Improvement of Bond Between Copper and Ceramics," vol. 27, issue 10B, p. 6278, Mar. 1985.*

* cited by examiner

Primary Examiner—Curtis Mayes
(74) Attorney, Agent, or Firm—DeLio & Peterson, LLC; Kelly M. Reynolds; Margaret A. Pepper

(57) ABSTRACT

The surface metallurgy of a green sheet may be controlled during processing to provide an increased resistance to low strength structural failure of the metal-ceramic interface under an input-output pad structure and increased pin-pull strength of input-output pads on alumina multilayer ceramic substrates. The surface area on a green sheet in the region where an input-output pad is to be screened is roughened in order to increase the contact surface area between the green sheet and the input-output pad. The mechanical interlock between the metal-ceramic interface is strengthened by the increased number of bonding points between the green sheet and the input-output metallurgy and the use of different screening materials.

20 Claims, 7 Drawing Sheets

METHOD AND STRUCTURE TO REDUCE LOW FORCE PIN PULL FAILURES IN CERAMIC SUBSTRATES

BACKGROUND OF THE INVENTION

1. Field of the Invention

This invention relates to the manufacture of ceramic substrates, such as multilayer ceramic ("MLC") substrates and, more particularly, to the process of manufacturing MLC substrates having input-output pad surface metallurgy with increased resistance to structural failure.

2. Description of Related Art

In order to satisfy the increasing need for higher performance packaging of integrated circuits, MLC substrates are being developed with higher density input-output ("I/O") pad structures. However, the use of new materials to build the required I/O pad structures as well as changes in the processing of ceramic substrates after sintering, has increased the incidence of substrate mechanical failures at the metal-ceramic interface, such as ceramic tear out ("CTO") of the I/O pads.

Generally, a weak I/O pad structure is one which fails when a low pulling force is applied to the I/O pad during I/O pad strength testing. A particular case known as "low force" structural failure is understood as failures of the I/O pad when a pull force of less than 10 pounds is applied in a pin-pull test. In a typical Alumina MLC package where, for example, 21-pound pins are used, the I/O pad is expected to withstand 21 pounds of force applied to the I/O pin in a pin-pull test without structural damage. If a force in excess of 21 pounds is applied to the I/O pin it is expected that shank failure of the I/O pin will occur. In this example, a weak I/O pad is one which structurally fails when a force of less than 21 pounds is applied to the I/O pin.

Certain of the mechanisms underlying the low force failures of I/O pad structures are known, and include pin-shank or solder ball failure, ceramic tear out, planar failures at the metal-ceramic interface and braze failure. In the case of high strength CTO, the I/O pin pulls out a large piece of the ceramic structure with it, the piece typically having a diameter larger than a third of the size of the I/O pad diameter. In Alumina substrates built with 21-pound pins, this type of failure occurs for a pin-pull force typically above 10 pounds and is directly dependent on the brazing material volume located in the proximity of the I/O pad perimeter. Lower amounts of brazing material near the I/O pad perimeter, increased pin centrality within the I/O pad, and optimized brazing material volume near the center of the I/O pad, typically minimizes this type of failure. A ceramic braze dam is sometimes used to control this type of problem. In the case of a low strength CTO pin-pull failure, the I/O pin pulls out a small piece of the ceramic, typically less than a third of the size of the I/O pad. On an Alumina substrate built with 21-pound pins, a low strength CTO pin-pull failure typically occurs for a pin-pull force less than 10 pounds. An extreme case of failure occurs when most of the fracture line travels along the metal-ceramic interface and little or none of the ceramic is pulled out with the I/O pin. This case, also classified as planar or interface failure, occurs less frequently. On an Alumina substrate built with 21-pound pins, a planar failure can easily occur for pin-pull force below 5 pounds.

While there is a general understanding of the mechanisms underlying these failures, an unacceptable fraction of the low force failures occur in Alumina MLC's for unknown reasons. Methods to reduce the incidence of these low force metal-ceramic interface failures have included the use of a ceramic braze dam placed above the I/O pad after sintering to reduce the stress caused by the braze-pin structure at the edge of the I/O pad. However, the ceramic dam does not resolve the problem of the I/O pin failing at the center of the I/O pad.

It is also known to alter the composition and manufacture of ceramic green sheets to control the strength of the ceramic material. U.S. Pat. No. 5,045,402 discloses a method of producing a toughened glass ceramic through the use of Zirconia particles. While this process produces a green sheet capable of withstanding increased stresses on the substrate, it does not improve the metal-ceramic interface binding strength under an I/O pad.

OBJECTS OF THE INVENTION

Bearing in mind the problems and deficiencies of the prior art, it is therefore an object of the present invention to provide a method and structure to reduce the incidence of low strength metal-ceramic interface failure under an I/O pad on an MLC substrate.

A further object of the invention is to provide a method and structure to increase the pin-pull strength of an I/O pad on an MLC substrate.

It is yet another object of the present invention to provide a method and structure to eliminate the need for a ceramic braze dam over an I/O pad on an MLC substrate.

It is yet a further object of the invention to modify the MLC metal-ceramic topology to change ceramic tear out population distribution and reduce the frequency of low strength CTO.

Still another object of the invention is to reduce the incidence of pin-pull test failures below 10 pounds of applied force on MLC substrates.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of manufacturing a multilayer ceramic board having increased resistance at a metal-ceramic interface comprising the steps of:

(a) providing a green sheet having a surface on which an input-output pad is to be disposed;

(b) roughening a portion of the surface in those areas corresponding to where the input-output pad is to be disposed;

(c) screening the input-output pad over the roughened portion of the surface; and (d) heat treating the green sheet and the input-output pad to create a bond between the pad and the surface.

In the preferred embodiment, the roughened portion of the surface extends to a depth of at least 1 mils below the surface of the green sheet.

The roughened portion of the surface of the green sheet may be formed by using a silicone coated paper or fibrous backing sheet in the casting of the green sheet or running the green sheet through a laminator to roughen the surface.

In another preferred embodiment the roughened surface of the green sheet is formed by providing a template onto which the roughness feature has been cast and embossing the surface roughness feature onto the green sheet.

In one preferred embodiment, the roughened surface is formed by depositing a concentric ring onto the green sheet over those areas where an input-output pad is to be disposed, or alternatively, screening the input-output pad over the roughened portion of the green sheet and then depositing the concentric ring over the input-output pad.

In the preferred embodiment, the shape of the ring corresponds to the shape of the input-output pad.

In yet another aspect, the roughened surface can be formed by providing holes on the green sheet in those areas where the input-output pad is to be disposed. In the preferred embodiment, the depth/size aspect ratio of the holes in less than 2. The holes on the green sheet may be formed by:

(i) providing a template having alumina particles extending from a surface;

(ii) contacting the green sheet with the template surface; and (iii) applying pressure to the template in order to create holes in the green sheet in those locations corresponding to where the input-output pad is to be disposed.

The average size of the alumina particles on the template is preferably in the range of 20–100 microns.

In yet another embodiment, the roughened surface of the green sheet is formed by imprinting the green sheet with a patterned surface in those areas where the input-output pad is to be disposed. The pattern imprinted on the green sheet is preferably an array of three dimensional shapes such as squares, rectangles, pyramids, inverted cones, dots, holes, semicircles, circles and grooves.

In yet another aspect, the present invention provides a method of manufacturing a multilayer ceramic board having increased resistance to structural failure at a ceramic-metal interface comprising the steps of:

(a) providing a green sheet having a surface on which an input-output pad is to be disposed;

(b) screening a first screening material on the green sheet in the areas corresponding to where the input-output pad is to be disposed;

(c) line embedding a pattern on the green sheet in those areas corresponding to where the input-output pad is to be disposed;

(d) screening a second screening material on the green sheet where the pattern has been embedded;

(e) disposing said input-output pad over the patterned portion of the surface of the green sheet and into the screening material; and (f) heat treating the green sheet, first and second screening materials and the input-output pad to create a bond between the input-output pad and the screening material surface.

In a preferred embodiment, the first and second screening materials can be the same, or different concentrations of the same material. The pattern selected is preferably an array of three dimensional shapes such as squares, rectangles, pyramids, inverted cones, dots, holes, semicircles, circles or grooves. Preferably, the pattern is extended to a depth of at least 1 mil below the surface of the green sheet.

In yet another aspect, the present invention provides a method of manufacturing a multilayer ceramic board having increased resistance to structural failure at a metal-ceramic interface comprising:

(a) providing a first green sheet having a surface on which an input-output pad is to be disposed;

(b) providing a second green sheet having a surface on which a shaped pattern is prepunched in each of those areas corresponding to where an input-output pad is to be disposed;

(c) laminating the second green sheet onto the top surface of the first green sheet;

(d) screening a material over the top surface of the second green sheet where the pattern has been punched;

(e) screening an input-output pad over the pattern portion of the second green sheet and into the screening material;

(f) heat treating the first and second green sheet, screening material and input-output pad to create a bond between the input-output pad, first and second green sheet and screening material.

In the preferred embodiment, the thickness of the second green sheet is less than 3 mils and the shaped pattern is a series of grooves, semicircles or holes.

In another preferred embodiment, a second screening material is used in step (e) to screen the input-output pad.

In a still further aspect, the present invention provides a multilayer ceramic board in a presintered state having increased strength at each ceramic-metal interface comprising:

(a) a green sheet having a surface on which an input-output pad is to be disposed;

(b) a roughened portion of the surface, the roughened portion corresponding to areas on the green sheet where an input-output pad is to be disposed; and (c) an input-output pad screened with a screening material over the roughened portion of the surface.

In the preferred embodiment, a patterned surface is imprinted on the green sheet to create the roughened portion of the green sheet surface in (b). The pattern is preferably an array of three-dimensional shapes, such as squares, rectangles, pyramids, inverted cones, dots, holes, semicircles, circles and grooves. The pattern should extend below the surface of the green sheet to a depth at least twice as large as the average diameter of each pattern shape.

In another preferred embodiment, the roughened portion of the green sheet surface in (b) comprises:

(i) a pattern line embedded in those areas corresponding to where each input-output pad will be disposed;

(ii) a second screening material, different from that of the green sheet, screened over those areas of the green sheet corresponding to where each input-output pad will be disposed.

Preferably, the depth of the pattern in (i) extends to a depth of at least 1 mil below the surface of the green sheet and the pattern is ring shaped.

In another embodiment of the present invention the roughened portion of the surface in (b) comprises a second green sheet laminated to the first green sheet, the second green sheet having a surface on which a shaped pattern is prepunched in each of those areas corresponding to where an input-output pad is to be disposed. The pattern on the second green sheet is preferably screened with one screening material and the input-output pad is screened with a another screening material. It is preferred that the thickness of the second green sheet be less than 8 mils.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying figures in which:

DESCRIPTION OF THE PREFERRED EMBODIMENT(S)

In describing the preferred embodiment of the present invention, reference will be made herein to FIGS. 1–14 of the figures in which like numerals refer to like features of the invention. Features of the invention are not necessarily shown to scale in the figures.

The present invention is directed to a method and apparatus for reducing the incidence of low strength structural failure of the metal-ceramic interface under an I/O pad structure and increasing the pin-pull strength of I/O pads on an Alumina MLC.

While the process of manufacturing an MLC substrate is complex and largely depends on the type of ceramic material and metallurgy used, many of the processing steps are common to all MLC ceramic types. An Alumina MLC substrate with pin-brazed I/O pads is used here for purposes of describing the present invention. It is understood that the method and structures described for an Alumina MLC are applicable to other ceramic types, I/O pad metallurgy, and I/O interconnecting schemes like solder balls, cast columns and wire bonds. Also, while only a single I/O pad is used here to describe the present invention, the processes and structures presented also apply to other I/O pads in the same green sheet or sintered ceramic substrate.

Figure 1:
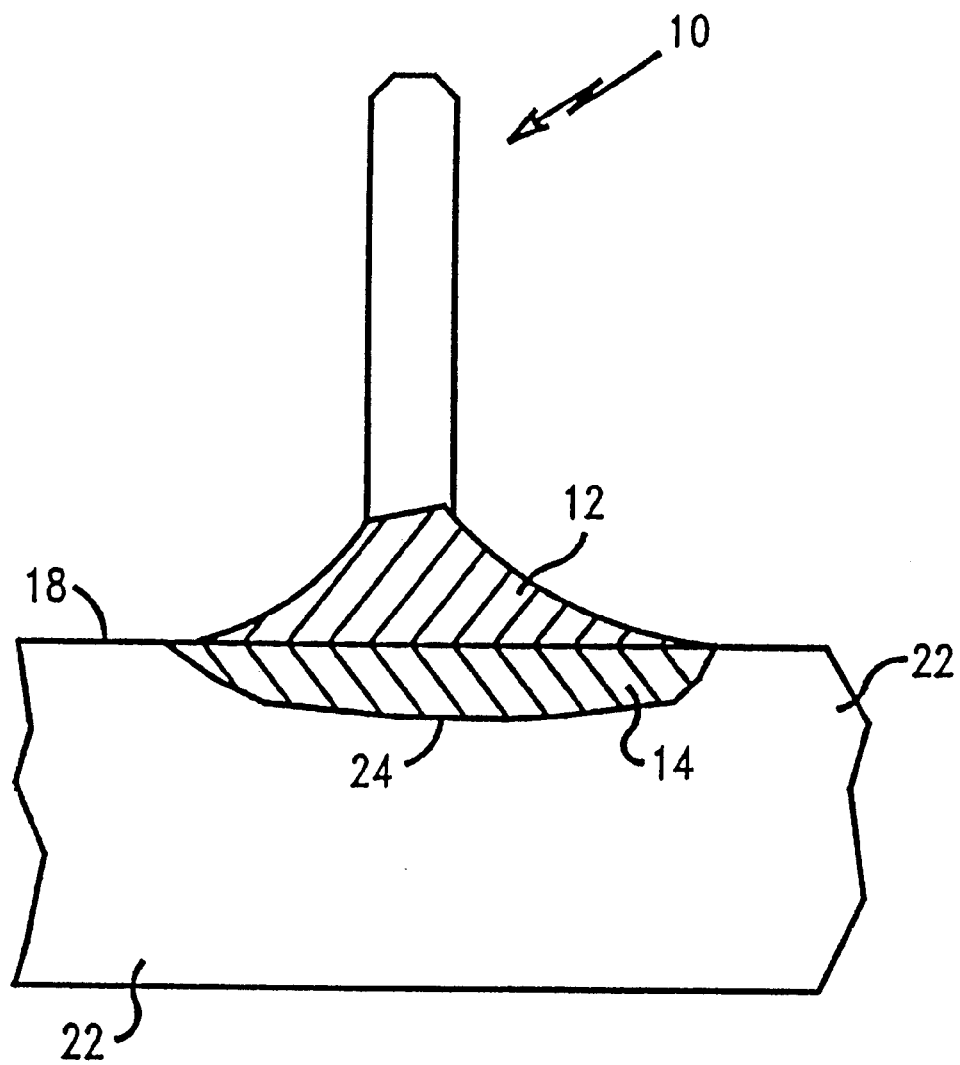
FIG. 1 is a vertical cross-sectional view of an I/O pin c attached to an I/O pad-MLC interface on a prior art post-sintered ceramic substrate.

FIG. 1 illustrates a post-sintered ceramic substrate 22 of the prior art. An I/O pin 10 is attached to I/O pad metallurgy 14 of a post-sinter ceramic substrate 22 using brazing material 12. The post-sinter I/O pad 14 extends below the top surface of the sintered ceramic substrate 22 to the metal-ceramic interface 24. In each of FIGS. 2, 3 and 4, a typical I/O pad-MLC interface failure mechanism is illustrated. As shown in each figure, the metal-ceramic interface failure occurs along fracture lines 16, 17 or 20, respectively. The fracture initiation point 11, shown at the intersection of the top surface 18 and the metal-ceramic interface 24, is shown here for illustration purpose only. The fracture initiation point 11 can also be found within the ceramic substrate 22, the I/O pad 14, or the brazing material 12.

Figure 2:
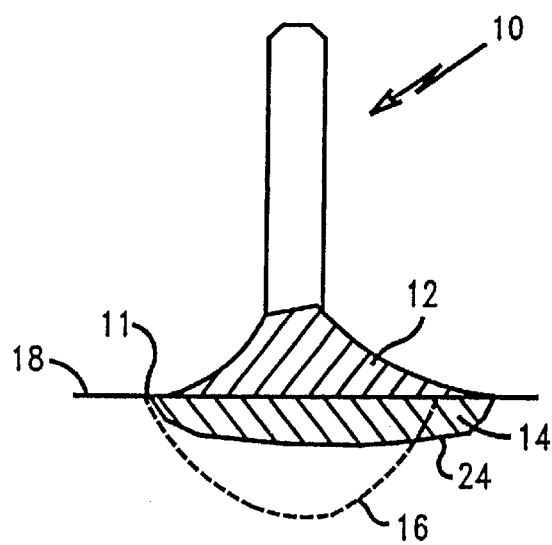
FIG. 2 is a vertical cross-sectional view of an I/O pin attached to an I/O pad-MLC interface illustrating high strength CTO.

In FIG. 2, the fracture line 16 illustrates a high strength CTO pin-pull failure. The fracture line extends underneath the I/O pad, well below the metal-ceramic interface 24, pulling a large portion of the ceramic substrate 22 out with the I/O pin 10.

Figure 3:
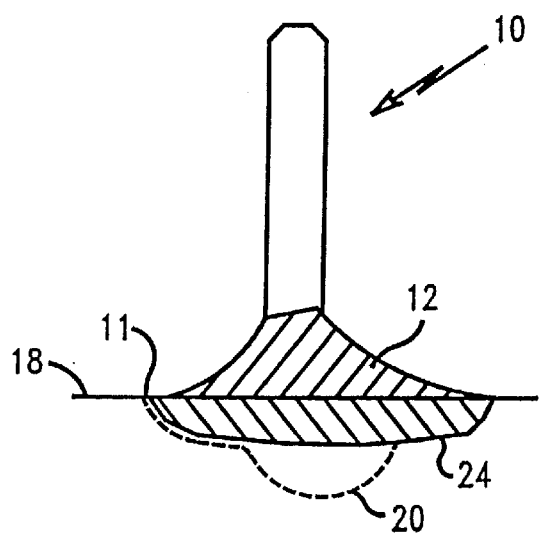
FIG. 3 is a vertical cross-sectional view of an I/O pin attached to an I/O pad-MLC interface illustrating low strength CTO.

In FIG. 3, the fracture line 20 illustrates a low strength CTO. Some of the fracture line 20 travels along and through the metal-ceramic interface 24, and a smaller portion of the ceramic substrate 22 is pulled out with the I/O pin 10.

Figure 4:
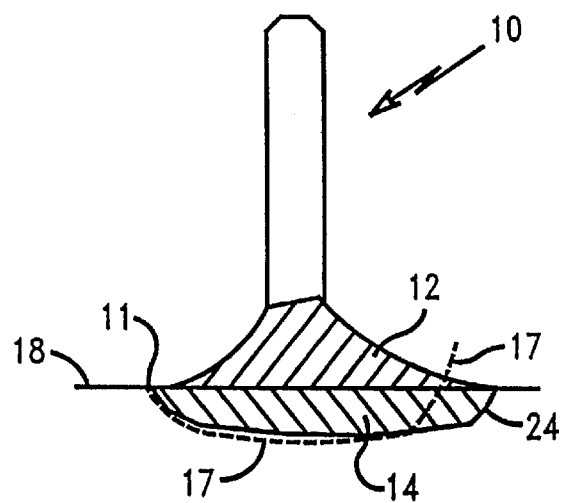
FIG. 4 is a vertical cross-sectional view of an I/O pin attached to an I/O pad-MLC interface illustrating planar or interface failure.

In FIG. 4, illustrating planar or interface failure, most of the fracture line 17 travels along the metal-ceramic interface 24 for a large portion of the I/O pad 14 before it cuts through a corner of the I/O pad 14, and brazing material 12, to the surface of the structure. Little or none of the ceramic substrate 22 is pulled out with the I/O pin 10.

Experimental data shows that both low strength CTO and planar failures can occur even when pin centrality is good and the brazing material volume is within the process specifications.

Figure 5:
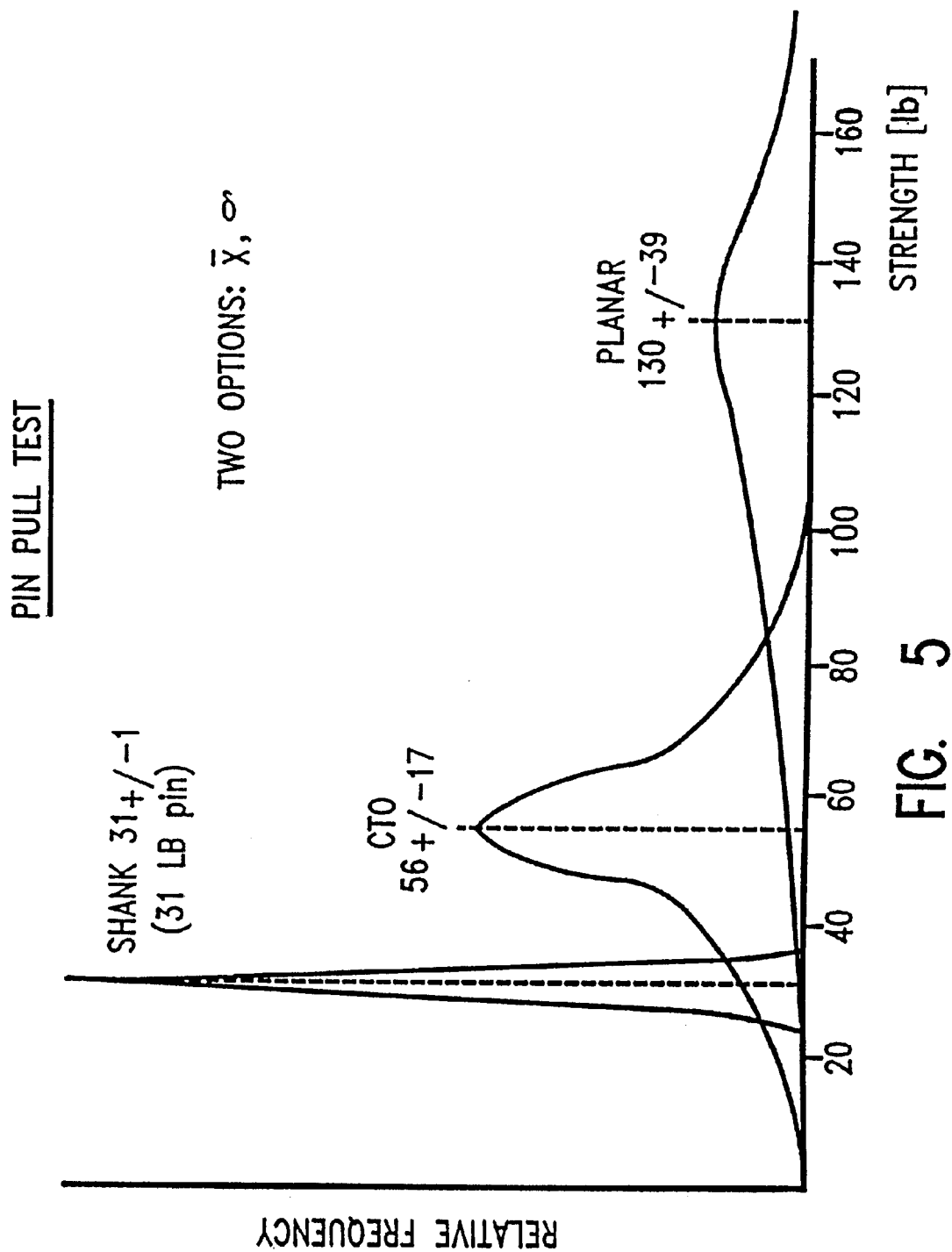
FIG. 5 is a graphical representation of I/O pad-MLC interface pin-pull strength (1b) versus relative frequency of failure, as function of shank, CTO or planar failure mechanisms.

To further illustrate the distinction among the I/O pad failure mechanisms of FIGS. 2, 3 and 4, substrates were built using 31-pound pins instead of the typical 21-pound pins. The stronger pins provided a larger quantity of non-shank failures which were then analyzed using a statistical model specialized for this situation containing three failure mechanisms: shank failure at 31 pounds, CTO failures, and planar failures. FIG. 5 illustrates the results of the analysis which includes the test data from over 7500 pins, where over 250 failures are CTO's and over 20 failures are planar. The data analysis shows that the average CTO failure should be expected at 56 pounds, while the average metal-ceramic interface failure should be expected at 130 pounds. Since the I/O pin used has a strength of 31 pounds, with only one pound standard deviation, the reason why some CTO and planar failures are observed experimentally is because the data dispersion for both CTO and planar failure mechanisms is large, and in both cases the average pin-pull strength is only three standard deviations above the 10 pounds limit.

Further analysis of the data shown in FIG. 5 provides a direct understanding of the expected population distribution from MLC substrates built with 21-pound pins. In this case, the distribution for shank failures will move towards the origin. The expected new shank failure distribution is 21 pounds ±1 pound. The decrease in the average shank failure will significantly reduce the incidence of the other two types of failures, but will not change the given distribution for a given material set, I/O pad geometry, I/O pad local stress distribution, and metal-ceramic intrinsic bonding strength.

While new ceramic materials are required to change the location of the average CTO away from its current location at 56 pounds, these changes may not impact its current standard deviation of 17 pounds. For a given ceramic material set, pin design, and I/O pad diameter, the only parameters available to reduce the CTO failure spread, or standard deviation, are modifications to the local stress distribution under the I/O pad and or modifications to the metal-ceramic interface geometry which introduces obstacles in the fracture path.

Low strength CTO and planar fails typically involve failure at the metal-ceramic interface bonding. The low incidence of these failure types is directly explained in FIG. 5, by the high 130 pounds average metal-ceramic interface strength. The large standard deviation measured here, 39 pounds, indicates a failure mechanism very sensitive to any processing and material perturbations to the expected I/O pad structure. Changing the average planar failure strength requires a direct change in the materials found at the metal-ceramic interface and/or processing changes which can alter the existing metal-ceramic chemical bond, although these changes are not expected to alter the standard deviation. Also, the total strength at the metal-ceramic interface can be increased by increasing the interfacial area. To reduce the planar strength variability it is necessary to properly modify the local stress distribution under the I/O pad and alter the metal-ceramic interface topology.

In the preferred embodiment, a thin green ceramic tape, typically between 100 and 300 microns thick, is cast from a slurry made from ceramic particles dispersed in an organic matrix. Green sheets are cut from the tape, punched, and then screened with an appropriate metal paste to provide a prescribed metal pattern. The I/O pads are typically screened during this processing step. The screened green sheets are then stacked and laminated to form a green laminate. The green laminate is then sized if necessary and subsequently sintered in a suitable sintering furnace. The sintering process removes all organic matter and allows the densification of all solid phases to produce a monolithic ceramic substrate which includes an electrically conductive metal phase in a ceramic matrix. In some cases, the I/O pads are added to the substrate at this stage of the manufacturing process. After sintering, the substrate surface metallurgy is plated with thin layers of nickel and gold as needed to provide a surface suitable for the brazing operation. At this point both silicon chips and I/O interconnecting structures are mounted on the ceramic substrate, most times using separate processing steps.

Figure 6:
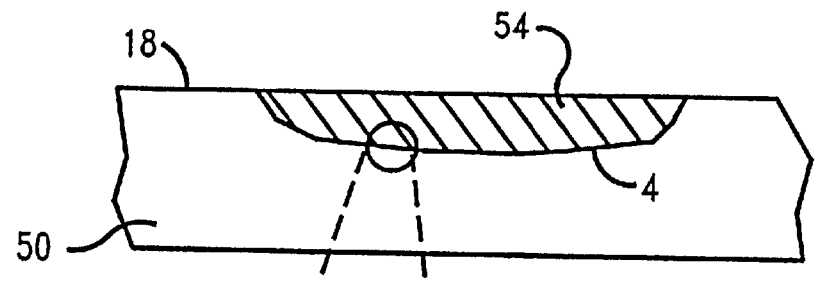
FIG. 6 is a perspective view of a cross-section of a typical I/O pad-MLC interface on a pre-sintered green sheet.

FIG. 6 illustrates the present invention in the pre-sintered state. The surface area on a green sheet 50 in the region where I/O pad 54 is to be screened is roughened to increase the contact surface area between the green sheet 50 and the I/O pad 541 thereby increasing the mechanical interlock between the metal-ceramic interface and increasing the number of bonding points between the ceramic green sheet 50 and the I/O pad 54 metallurgy. After sintering, an I/O pin 10 is bonded to the post-sinter I/O pad 14 of the ceramic substrate 22 using brazing material 12.

Figure 7:
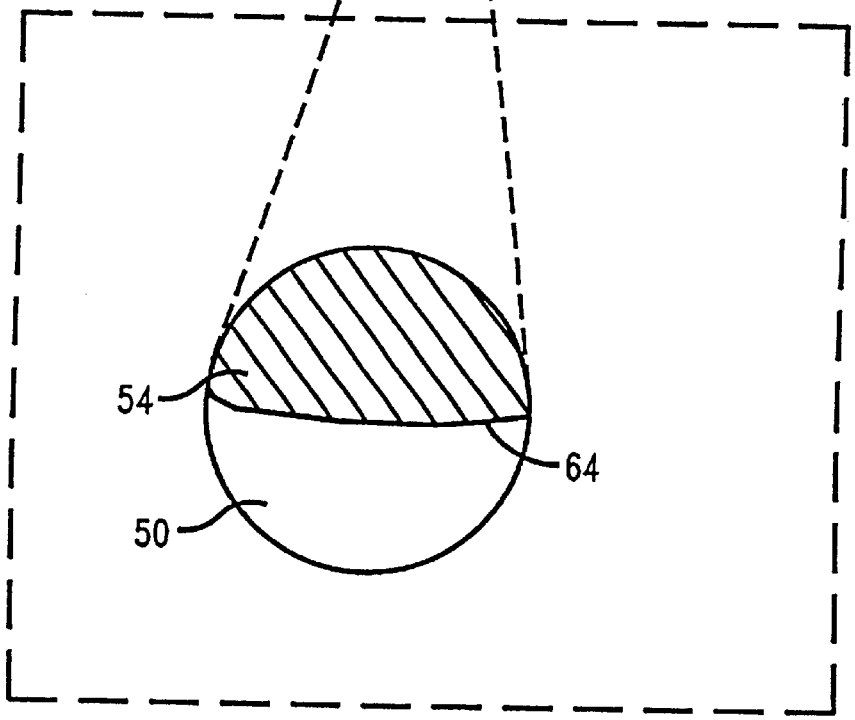
FIG. 7 is an exploded view of the I/O pad-MLC interface of FIG. 6.

In the prior art, as illustrated in FIGS. 6 and 7, the metal-ceramic interface 64 roughness extends to a depth, below the surface of the green sheet 50, of less than one micron and more typically about 0.3 microns in the pre-sintered metal-ceramic 64 interface area between the screened pre-sinter I/O pad 54 and the green sheet 50. FIG. 7 is an exploded view of a portion of the metal-ceramic interface 64 of FIG. 6. The surface roughness of the green sheet 50 at each metal-ceramic interface 64 can be artificially increased by using a silicone coated paper or fibrous backing sheet in the casting of the green sheet 50 to produce a controlled and uniformly roughened surface green sheet 50 in each area where an I/O pad 54 is to be screened. A uniform surface roughness may also be formed on the green sheet 50 by running a continuous roll, or cut sheet, through the rolls of a laminator. The surface roughness feature may be incorporated in the rolls of the laminator. Alternatively, the controlled surface roughness on green sheet 50 may be formed by using a template to emboss the features onto the green sheet 50. The surface of the template has the roughness feature incorporated into it and the pattern is embossed onto the green sheet 50 by simple lamination.

The controlled surface roughness feature may also be formed by providing controlled depth holes in the green sheet 50. The preferred depth/size aspect ratio of the holes is less than 2, and the hole frequency should be maximized without compromising the mechanical integrity of the green sheet 50. The controlled depth holes can be created by pressing sharp and tiny objects onto the green sheet 50 surface. For example, a template can be fabricated by selectively flame spraying Alumina particles with an average size in the range of 20 to 100 microns. The template is then pressed against the green sheet 50 with predetermined pressure to poke holes in the surface of the green sheet in those areas where the I/O pad 54 will be subsequently screened. The holes can also be created in regular and random patterns using conventional punching techniques such as mechanical punching, gang punching, or chemical and/or photo-patterning or processing techniques.

Figure 8:
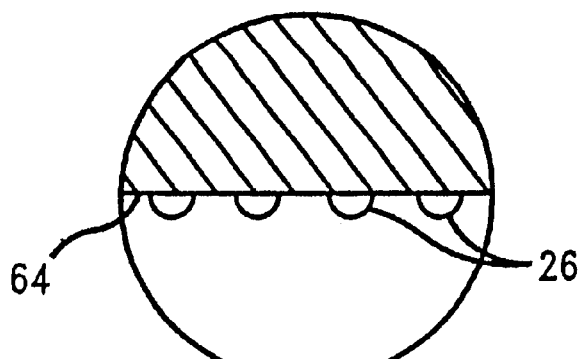
FIG. 8 is a cross-sectional view of the I/O pad-MLC interface of FIG. 7, illustrating a pattern of paste bumps imprinted on the MLC under the area of the I/O pad.
Figure 9:
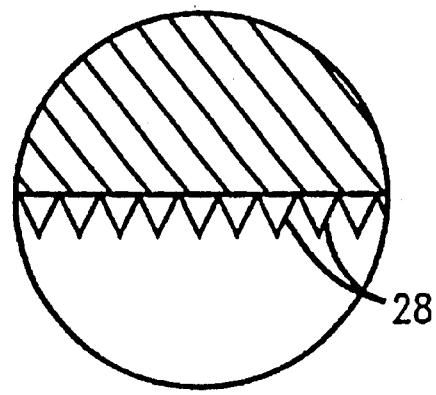
FIGS. 9 and 10 are cross-sectional views of the I/O pad-MLC interface of FIG. 7 illustrating the use of stamping and carving, respectively, to embed a pattern in the MLC under the area of the I/O pad.
Figure 10:
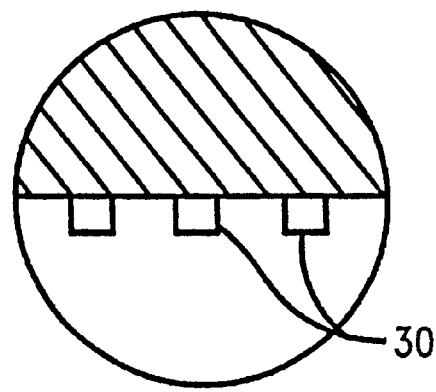

Alternatively, a patterned surface relief can be selectively imprinted on the green sheet 50 to create a non-flat region on the green sheet surface where the I/O pad 54 will be screened to provide increased mechanical interlocking between the metal and ceramic phases under the I/O pad 54. Examples of typical surface patterns are illustrated in FIGS. 8, 9 and 10, where the ceramic surface of the green sheet 50 has been locally modified to provide the desired surface pattern using mechanical, chemical, or optical means such as embossing, machining, etching, solvents, laser, electron beam and UV induced chemical reactions. The I/O pad 54 metallurgy is then screened to cover and fill the ceramic topography created to form the patterns shown in FIGS. 8, 9 and 10. In this manner, the I/O pad 54 has increased metal-ceramic contact surface area under the I/O pad 54, while the materials used remain unchanged. The pattern imprinted should extend to a depth of at least 10 microns below the surface of the green sheet, or alternatively, to a depth at least twice as deep as the average diameter of each pattern shape. For example, in FIG. 8, paste bumps 26 are formed in the green sheet 50 thereby increasing the contact surface area on the green sheet 50 under the area of the I/O pad 54. The paste bumps 26 may be formed by any of the means previously described. In FIG. 9, a pattern of inverted conical shapes 28 is stamped into the green sheet 50, and in FIG. 10, a pattern of square shaped forms 30 are carved into the green sheet 50. The patterns in FIGS. 9 and 10 may be regular or irregular in frequency. In the preferred embodiment, the pattern is imprinted or mechanically, chemically, or optically formed on the green sheet 50 under the area of an I/O pad 54 and can be any shape, for example, dots, holes, rings, short lines, cones or pyramids. The shape should extend below the surface of the green sheet 50 where the I/O pad 54 will later be screened to a minimum depth which is at least twice as large as the average diameter of the ceramic surface roughness.

Figure 11:
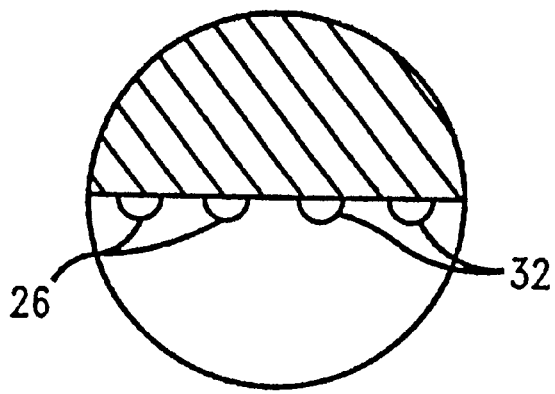
FIG. 11 is a cross-sectional view of the I/O pad-MLC interface of FIG. 7 illustrating the use of an alternate screening material to screen a pattern embedded in the MLC under the area of the I/O pad.

In another embodiment of the present invention, a second screening step is used to increase the surface contact area of the metal-ceramic interface 64. A pattern is first screened over the area where an I/O pad 54 will be screened, then line embedded on the green sheet 50, and subsequently screened with the I/O pad metallurgy in a second screening step. The embedded pattern provides an increased contact area for mechanical and chemical bonding of the I/O pad 54 metallurgy and green sheet 50. When the pattern is screened with the same metal paste used to screen the I/O pad 54, the resulting I/O pad structure is equivalent to the I/O pad structures of FIGS. 8–10. As shown in FIG. 11, an alternative screening material 32 can be used in the second screening step to screen the embedded pattern. This alternative paste may be from the same group of pastes used to screen the I/O pad, a different concentration of the paste used to screen the I/O pad, or may be a different composition yielding different mechanical or chemical bonding properties. The different compositions can include metal, copper, copper like metals, gold, silver or nickel.

The use of a different screening material 32 modifies the local stress distribution characteristics under the I/O pad 54 and/or increases the chemical bonding between the I/O pad 54 and green sheet 50. The embedded pattern can typically be an array of small dots, or any acceptable shape extending to a depth of at least 1 mil below the surface of the green sheet 50. The screening material 32 can be any compatible metal paste, or alternatively, a metal/ceramic composite paste which will enhance the bonding between the I/O pad 54 and the green sheet 50.

Figure 12:
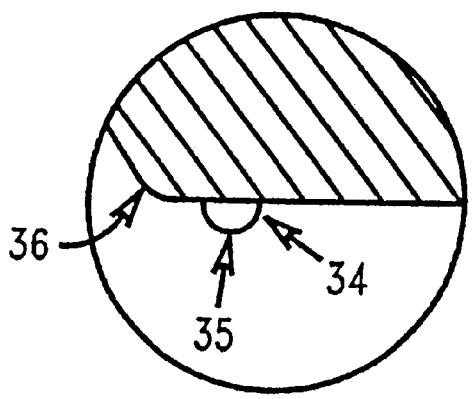
FIG. 12 is a cross-sectional view of a concentric ring deposited under the I/O pad showing the semi-circular shape of the groove forming the ring.

In another embodiment of this invention, one or more concentric rings 34 may be deposited on the green sheet 50 before or after the I/O pad metallurgy is screened as shown in FIG. 12. Here, the first, and sometimes only ring 34, needs to be located in close proximity to the perimeter of the I/O pad 54 and is used to modify the local stress distribution characteristics at the I/O pad perimeter and modify the response of the I/O pad 54 during pin-pull testing. The ring 34 is described here as circular because the I/O pad shape is also described as circular. If the shape of the I/O pad 54 deviates from a circular shape, then the "ring" shape should be modified correspondingly.

Figure 13:
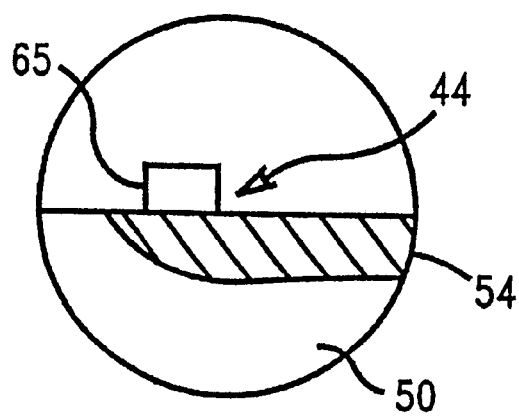
FIG. 13 is a cross-sectional view of a ring screened over the I/O pad metal.

FIG. 13 shows metal-ceramic interface 64 topography which includes a ring 65 created after the I/O pad 54 metal is screened. The ring 34 may be formed by screening after the I/O pad 54 is embedded in the green sheet 50.

Figure 14:
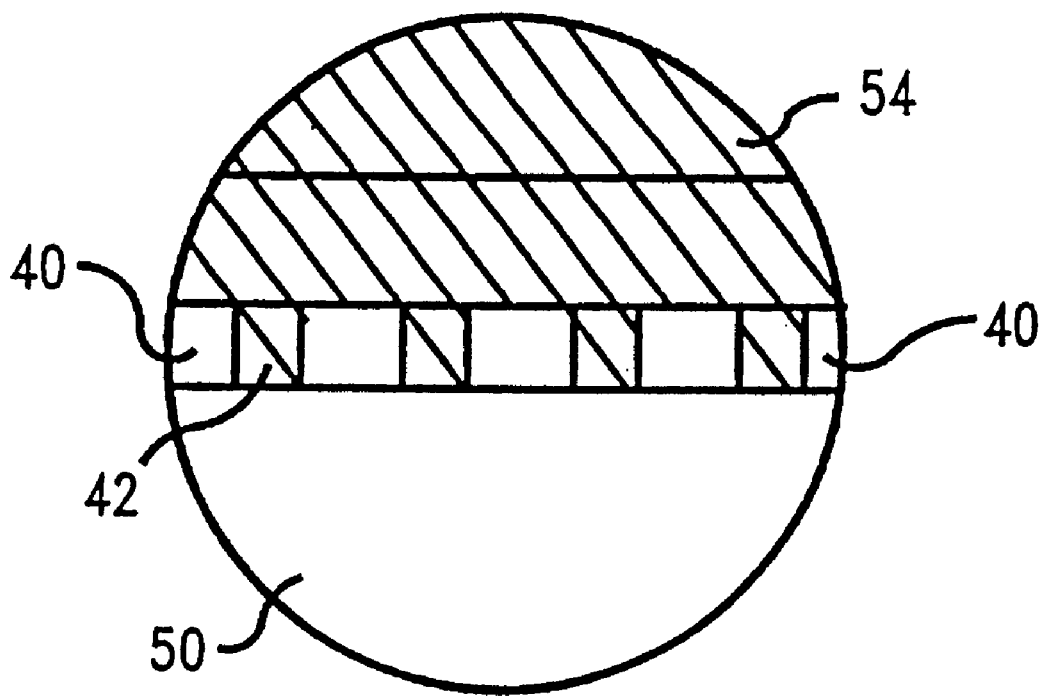
FIG. 14 is a cross-sectional view of the I/O pad-MLC interface of FIG. 7, illustrating the use of a two layer ceramic green sheet structure, the second layer containing holes or grooves which are subsequently filled with a screening paste.

An alternative method to create the controlled depth holes and grooves under the I/O pads 54 is with the use of one or more thin ceramic green sheets 40. The thickness of the thin greensheet 40 can range up to 8 mils, but is preferably 1 mil. The holes or grooves in the thin green sheet 40 can be fabricated using any one of the methods previously described. For example, a thin ceramic green sheet 40 of the same or similar material as greensheet 50, with at least one groove or hole 42 in those areas where the I/O pad 54 is to be disposed, is sublaminated over the green sheet 50 to form a two layer ceramic structure as shown in FIG. 14. The sublaminated body should hold during screening and not distort during subsequent drying. The I/O pad metallurgy is chosen from molybdenum, tungsten, copper, nickel, alloys and metal-ceramic composites. The thin green sheet 40 is sublaminated over green sheet 50, and the grooves or holes 42 are filled with a screening paste during the screening of the I/O pad 54. Alternatively, the grooves or holes 42 may be filled with a screening paste different from the paste used to screen I/O pad 54. This alternative paste may be from the same group of pastes used to screen the I/O pad, a different concentration of the paste used to screen the I/O pad, or may be a different composition yielding different mechanical or chemical bonding properties. The different compositions can include metal, copper, copper like metals, gold, silver or nickel.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of manufacturing a multilayer ceramic board having increased resistance to structural failure at a metal-ceramic interface comprising:

(a) providing a green sheet having a surface on which an input-output pad is to be disposed;

(b) roughening a portion of said surface in those areas corresponding to where said input-output pad is to be disposed, the roughened portion of said surface extending to a depth of at least 1 mil below said surface;

(c) screening said input-output pad over the roughened portion of said surface; and (d) heat treating said green sheet and said input-output pad to create a bond between said pad and said surface.

2. The method of claim 1, wherein step (b) comprises running said green sheet through a laminator to roughen said surface.

3. The method of claim 1, wherein the roughened surface of step (b) is formed by providing holes on the green sheet in those areas where said input-output pad is to be disposed.

4. The method of claim 3, wherein the depth/size aspect ratio of the holes is less than 2.

5. The method of claim 1, wherein the roughened surface in step (b) is formed by imprinting the green sheet with a patterned surface in those areas corresponding to where said input-output pad is to be disposed.

6. The method of claim 5, wherein the pattern imprinted on the green sheet is an array of three dimensional shapes selected from the group consisting of squares, rectangles, pyramids, inverted cones, dots, holes, semicircles, circles and grooves, at those positions on the green sheet where said input-output pad is to be disposed.

7. A method of manufacturing a multilayer ceramic board having increased resistance to structural failure at a metal-ceramic interface comprising:

(a) providing a green sheet having a surface on which an input-output pad is to be disposed;

(b) roughening a portion of said surface in those areas corresponding to where said input-output pad is to be disposed, the roughened surface being formed by depositing a concentric ring on said green sheet over the areas where an input-output pad is to be disposed;

(c) screening said input-output pad over the roughened portion of said surface; and (d) heat treating said green sheet and said input-output pad to create a bond between said pad and said surface.

8. The method of claim 7, wherein the shape of the ring corresponds to the shape of the input-output pad.

9. A method of manufacturing a multilayer ceramic board having increased resistance to structural failure at a metal-ceramic interface comprising:

(a) providing a green sheet having a surface on which an input-output pad is to be disposed;

(b) roughening a portion of said surface in those areas corresponding to where said input-output pad is to be disposed, the roughened surface being formed by providing holes on the green sheet in those areas where said input-output pad is to be disposed, the holes being formed in the green sheet by:
  (i) providing a template having alumina particles extending from a surface;
  (ii) contacting said green sheet with the template surface; and
  (iii) applying pressure to said template in order to create holes in the green sheet in those locations corresponding to where said input-output pad is to be disposed;
(c) screening said input-output pad over the roughened portion of said surface; and
(d) heat treating said green sheet and said input-output pad to create a bond between said pad and said surface.

10. The method of claim 9, wherein the alumina particles have an average size in the range of 20 to 100 microns.

11. A method of manufacturing a multilayer ceramic board having increased resistance to structural failure at a metal-ceramic interface comprising:
  (a) providing a green sheet having a surface on which an input-output pad is to be disposed;
  (b) selectively roughening a portion of the green sheet surface in those areas corresponding to where said input-output pad is to be disposed by (i) providing a template with a surface on which a surface roughness feature has been cast and (ii) embossing the surface roughness feature onto the green sheet surface;
  (c) screening said input-output pad over the roughened portion of said green sheet surface; and
  (d) heat treating said green sheet and said input-output pad to create a bond between said pad and said green sheet surface.

12. A method of manufacturing a multilayer ceramic board having increased resistance to structural failure at a ceramic-metal interface comprising:
  (a) providing a green sheet having a surface on which an input-output pad is to be disposed;
  (b) screening a first screening material on said green sheet in the areas corresponding to where said input-output pad is to be disposed;
  (c) line embedding a pattern on said green sheet in those areas corresponding to where said input-output pad is to be disposed;
  (d) screening a second screening material on said green sheet where said pattern has been embedded;
  (e) disposing said input-output pad over the patterned portion of said surface and into said material; and
  (f) heat treating said green sheet, first and second screening material and said input-output pad to create a bond between said pad and screening material surface.

13. The method of claim 12, wherein the second screening material used in step (d) is the same as the first screening material used in step (b).

14. The method of claim 12, wherein the second screening material of step (d) is a different concentration of the first screening material used in step (b).

15. The method of claim 12 wherein the pattern of step (c) is an array of three dimensional shapes selected from the group consisting of squares, rectangles, pyramids, inverted cones, dots, holes, semicircles, circles and grooves, at those positions on the green sheet where said input-output pad is to be disposed.

16. The method of claim 12, wherein the pattern of step (c) is extended to a depth of at least 1 mil below the surface of the green sheet.

17. A method of manufacturing a multilayer ceramic board having increased resistance to structural failure at a metal-ceramic interface comprising:
  (a) providing a first green sheet having a surface on which an input-output pad is to be disposed;
  (b) providing a second green sheet having a surface on which a shaped pattern is prepunched in each of those areas corresponding to where said input-output pad is to be disposed;
  (c) laminating said second green sheet onto the top surface of the first green sheet;
  (d) screening a material over the top surface of the second green sheet where said pattern has been punched;
  (e) screening said input-output pad over the pattern portion of said second green sheet and into said material; and
  (f) heat treating said first and second green sheet, screening material and input-output pad to create a bond between said input-output pad, first and second green sheet and screening material.

18. The method of claim 17, wherein the thickness of said second green sheet is less than 3 mils.

19. The method of claim 17, wherein the shaped pattern of step (b) is a series of grooves, semicircles or holes.

20. The method of claim 17, wherein a second screening material is used in step (e) to screen said input-output pad.

* * * * *